US007260508B2

(12) United States Patent
Lim et al.

(10) Patent No.: US 7,260,508 B2
(45) Date of Patent: Aug. 21, 2007

(54) METHOD AND SYSTEM FOR HIGH-RESOLUTION MODELING OF A WELL BORE IN A HYDROCARBON RESERVOIR

(75) Inventors: Kok-Thye Lim, San Ramone, CA (US); Steven B. Ward, Austin, TX (US); Stephen R. Kennon, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 1230 days.

(21) Appl. No.: 09/896,136
(22) Filed: Jun. 29, 2001
(65) Prior Publication Data

US 2002/0072883 A1 Jun. 13, 2002

Related U.S. Application Data

(60) Provisional application No. 60/215,697, filed on Jun. 29, 2000.

(51) Int. Cl.
*G06F 17/10* (2006.01)
*G06F 7/48* (2006.01)

(52) U.S. Cl. .............................................. 703/2; 703/10
(58) Field of Classification Search ..................... 703/2, 703/10; 702/16, 13
See application file for complete search history.

(56) References Cited

U.S. PATENT DOCUMENTS

| 3,029,018 | A |   | 4/1962  | Floyd, Jr.     |       |
|-----------|---|---|---------|----------------|-------|
| 3,302,710 | A |   | 2/1967  | Odeh           |       |
| 4,821,164 | A | * | 4/1989  | Swanson        | 702/5 |
| 5,255,212 | A |   | 10/1993 | Kondoh et al.  |       |
| 5,432,718 | A |   | 7/1995  | Molvig et al.  |       |
| 5,553,009 | A |   | 9/1996  | Meshkat et al. |       |
| 5,572,634 | A |   | 11/1996 | Duluk, Jr.     |       |

(Continued)

FOREIGN PATENT DOCUMENTS

| EP | 0 709 789 A2  | 5/1996  |
|----|---------------|---------|
| EP | 0 801 364 B1  | 7/2003  |
| FR | 2775094       | 8/1999  |
| GB | 2326747 A     | 12/1998 |
| WO | WO 99/40532   | 8/1999  |
| WO | WO 99/52048   | 10/1999 |
| WO | WO 99/57418   | 11/1999 |
| WO | WO 02/01251 A2 | 1/2002 |
| WO | WO 02/02901 A2 | 1/2002 |
| WO | WO 02/03101 A2 | 1/2002 |
| WO | WO 02/03103 A2 | 1/2002 |
| WO | WO 02/03262 A2 | 1/2002 |
| WO | WO 02/03263 A2 | 1/2002 |
| WO | WO 02/03264 A2 | 1/2002 |
| WO | WO 02/03265 A2 | 1/2002 |

OTHER PUBLICATIONS

Peter A. Forsyth, "A Control–Volume, Finite–Element Method for Local Mesh Refinement in Thermal Reservoir Simulation", SPE 1990, pp. 561–566 and 91–96.*
H. S. Naji, H. Kazemi, "A Fully Implicit, Three–Dimensional, Two–Phase, Control–Volume Finite Element Model for the Simulation of Naturally Fractured Reserviors" SPE 36279, Oct. 1996, pp. 1–13.*

(Continued)

*Primary Examiner*—Kevin J. Teska
*Assistant Examiner*—Dwin M. Craig
(74) *Attorney, Agent, or Firm*—Toler, Larson & Abel, LLP

(57) ABSTRACT

A method and system are disclosed for high-resolution modeling of a well bore in a reservoir. An embodiment of the present disclosure comprises the steps of constructing a first unstructured mesh having a plurality of n-dimensional simplices corresponding to a first modeled system (space), defining a surface bounding a second modeled space, identifying a subset of the plurality of n-dimensional simplices of the first mesh that are intersected by the surface, and modifying the subset of simplices so as to adapt the first mesh such that it comprises a second mesh and a third mesh, wherein the second mesh comprises a set of simplices located entirely interior to the surface and wherein the third mesh comprises another set of simplices located entirely exterior to said surface.

31 Claims, 8 Drawing Sheets

U.S. PATENT DOCUMENTS

| | | | |
|---|---|---|---|
| 5,604,911 A | | 2/1997 | Ushiro |
| 5,617,322 A | | 4/1997 | Yokota |
| 5,675,521 A | | 10/1997 | Holzhauer et al. |
| 5,699,271 A | | 12/1997 | Sagawa et al. |
| 5,710,726 A | | 1/1998 | Rowney et al. |
| 5,740,342 A | | 4/1998 | Kocberber ............... 395/120 |
| 5,754,181 A | | 5/1998 | Amdursky et al. |
| 5,891,131 A | | 4/1999 | Rajan et al. |
| 5,966,524 A | | 10/1999 | Burnett et al. |
| 5,999,187 A | | 12/1999 | Dehmlow et al. |
| 6,014,473 A | | 1/2000 | Hossack et al. |
| 6,018,497 A | * | 1/2000 | Gunasekera ............... 367/72 |
| 6,028,607 A | | 2/2000 | Chan |
| 6,041,017 A | | 3/2000 | Goldsberry |
| 6,052,520 A | | 4/2000 | Watts, III |
| 6,054,992 A | * | 4/2000 | Gibson ..................... 345/424 |
| 6,064,810 A | | 5/2000 | Raad et al. |
| 6,070,125 A | | 5/2000 | Murphy et al. |
| 6,078,869 A | | 6/2000 | Gunasekera |
| 6,106,561 A | | 8/2000 | Farmer |
| 6,191,796 B1 | * | 2/2001 | Tarr ......................... 345/581 |
| 6,313,837 B1 | | 11/2001 | Assa et al. |
| 6,366,279 B1 | * | 4/2002 | Gorman .................... 345/419 |
| 6,445,390 B1 | * | 9/2002 | Aftosmis et al. .......... 345/421 |
| 6,448,788 B1 | | 9/2002 | Meaney et al. |
| 6,516,080 B1 | | 2/2003 | Nur |
| 6,552,724 B1 | | 4/2003 | Marshall |
| 6,587,104 B1 | | 7/2003 | Hoppe |
| 6,608,628 B1 | | 8/2003 | Ross et al. |
| 6,633,837 B1 | * | 10/2003 | Dye et al. ..................... 703/9 |
| 6,674,432 B2 | | 1/2004 | Kennon et al. |
| 6,816,820 B1 | | 11/2004 | Friedl et al. |
| 2002/0032494 A1 | | 3/2002 | Kennon et al. |
| 2002/0032550 A1 | | 3/2002 | Ward et al. |
| 2002/0035453 A1 | | 3/2002 | Pond, Jr. et al. |
| 2002/0046014 A1 | | 4/2002 | Kennon |
| 2002/0067373 A1 | | 6/2002 | Roe et al. |
| 2002/0072883 A1 | | 6/2002 | Lim et al. |
| 2002/0082813 A1 | | 6/2002 | Lim et al. |

OTHER PUBLICATIONS

F. Cuisiat, M. Gutierrez, R.W. Lewis, I. Masters, "Petroleum Reservoir Simulation Coupling Flow and Deformation" SPE 50636 1998, pp. 63–72.*

Larry C. Young, "Rigorous Treatment of Distorted Grids in 3D" SPE 51899, 1999, pp. 1–14.*

P.A. Forsyth, et al., "Local Mesh Refinement and Modeling of Faults and Pinchouts", SPE Form Evaluation, Jun. 1986, vol. 1, No. 3, pp. 275–285, XP-002191830.

Y. Ding, et al., "Developement of Dynamic Local Grid Refinement in Reservoir Simulation", Proceedings of the 13th SPE Symposium on Reservoir Simulation, New Orleans, LA, Feb.–Mar. 1993, pp. 501–510. XP-002191831.

S. Verna, et al., "A Control Volume Scheme for Flexible Frids Reservoir in Simulation", Proceedings of the 1997 SPE Reservoir Simulation Symposium, Dallas, TX, Jun. 1997, pp. 215–227. XP-002191832.

S. Kocberber, et al., "An Automatic, Unstructured Control Volume Generation System for Geologically Complex Reservoirs", Proceedings of the 1997 SPE Reservoir Simulation Symposium, Dallas, TX, Jun. 1997, pp. 241–252. XP-002191833.

Y. Kuwauchi, et al., "Development and Applications of a Three Dimentsional Voronoi–Based Fexible Grid Black Oil Reservoir Simulator", SPE Asia Specific Oil & Gas Congerence, Adelaide, Australia, Oct. 1996, pp. 1–12. XP-002191834.

R. Page, et al., "A Functional Program Describing a Simple Reservoir Model and Its Potential for Parallel Computation", Proceedings of the 1990 Symposium on Applied Computing, IEEE, Apr. 1990, pp. 85–91.

C. Giertsen, et al., "Volume Visulization of Sparse Irregular Meshes", Computer Graphics and Applications, IEEE, vol. 2, No. 2, Mar. 1992, pp. 40–48.

S. Ghosh, "Curvilinear Local Grid Refinement", SPE 50633, SPE European Petroleum Conference, The Netherlands, Oct., 20–22, 1998.

H. N. Sharpe, et al., "A New Adaptive Orthogonal Grid Generation Procedure for Reservoir Simulation" 65th Annual Technical Conference and Exhibition of the Society of Petroleum Engineers, New Orleans, LA. Sep. 23–26, 1990.

M. Wheeler, et al., "A Parallel Multiblock/Multidomain Approach for Reservoir Simulation", Proceedings of the 1999 15th Symposium on Reservoir Simulation, Houston, TX, Feb. 1999. XP-002188857.

D. Kahaner, et al., "An Expreimental Algorithm for N–Dimensional Adaptive Quadrature", ACM Transactions on Mathematical Software (TOMS), Mar. 1979, pp. 86–96.

Y. Ozdogan, "Seismic Data Processing", Society of Exploration Geophysics, Tulsa, OK, 1991, pp. 514–515.

S. Norris, et al., "Modeling Fluid Flow Around Horizontal Wellbores", Proceedings: SPE Annual Technical Conference and Exhibition 1990 Part 4, New Orleans, LA Sep. 23–26, 1990, vol. SIGMA, pp.65–75.

P. Perrochet, "Finite Hyperelements: A 4D Geometrical Framework Using Coariant Baes and Metric Tensors" Communications in Numberical Methods in Engineering, Jun. 1995, UK, vol. 11, No. 6, pp. 525–534.

J.M.M. Regtien, et al., "Interactive Reservoir Simulation", Proceedings of the 13th Symposium on Reservoir Simulation, San Antonio, TX Feb. 12–15, pp. 545–552.

C. Buckalew, et al., "Oilfield Visulization on the PC Platform", 2000 SPE/AAPG Western Regional Meeting, Jun. 19–23, 2000, pp. 1–5.

E. Farkas, Linearization Techniques of Reservoir Simulation Equations: Fully Implicit Cases, Proceedings of the 1997 SPE Reservoir Simulation Symposium, Dallas, Texas Jun. 8–11, 1997, pp. 87–95.

E. Farkas, Linearization Techniques of Reservoir Simulation Equations: Fully Implicit Cases, Richardson, Texas, Dec. 1998, vol. 3, No. 4, pp. 316–323.

P. Benedeck, Capacitances of Planar Multiconductor Configuration on a Dielectric Substrate by a Mixed Order Finite–Element Method; IEEE1974.

Fu, et al., Time Integration Procedures for a Cyclic Thermoviscoplasticity Model for Pb–Sn solder applications, IEEE 1996.

P. J. Zwart, et al., "Space–Time Meshing for Two–Dimensional Moving Boundary Problems", Proceedings of the Seventh International Meshing Roundtable, pp. 187–199, 1998.

S. L. Ho, et al., "Generation and Rotation of 3–D Finite Element Mesh for Skewed Rotor Induction Motors Using Extrusion Technique", IEEE Transactions on Magnetics, pp. 1266–1269, May 1999.

* cited by examiner

METHOD AND SYSTEM FOR HIGH-RESOLUTION MODELING OF A WELL BORE IN A HYDROCARBON RESERVOIR

RELATED INFORMATION

This application claims priority under 35 U.S.C. 119(e) to provisional patent application No. 60/215,697, filed Jun. 29, 2000, entitled "Method and System for Oil Reservoir Simulation and Modeling," which is hereby fully incorporated by reference.

TECHNICAL FIELD OF THE INVENTION

This invention relates generally to methods and systems for modeling physical systems using finite element problem analysis and, more specifically, to methods and systems for simulating geological structures and corresponding fluid flow, especially in hydrocarbon reservoirs. Even more specifically, this invention relates to a method and system for high-resolution modeling of a well bore in a hydrocarbon reservoir.

BACKGROUND OF THE INVENTION

Physical systems can be modeled mathematically to simulate their behavior under different conditions. A wide variety of means exists to model physical systems, ranging from the very simplistic to the extremely complicated. One of the more complicated means to model physical systems is through the use of finite element analysis. As the name implies, finite element analysis involves a representation of individual, finite elements of a physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization, or mesh generation. The region is represented by functions defined over each element. This generates a number of local functions that are much simpler than those which would be required to represent the entire region. The next step in finite element modeling is to analyze the response for each element. This is accomplished by building a matrix that defines the properties of the various elements within the region and a vector that defines the forces acting on each element in the region. Once all the element matrices and vectors have been created, they are combined into a structure matrix equation. This equation relates nodal responses for the entire structure to nodal forces. After applying boundary conditions, the structure matrix equation can be solved to obtain unknown nodal responses. Intra-element responses can be interpolated from nodal values using the functions that were defined over each element.

As indicated above, finite element modeling involves the creation of a mesh of finite elements. The elements are defined by nodes within the problem space. The nodes are simply points in space. The lines between the nodes are referred to as edges. The mesh is typically a structured mesh. In other words, the mesh is defined in three dimensions so that the elements within the problem space are hexahedrons. For example, they may be cubes or rectangular prisms (equivalently, in two-dimensional problems, the elements would be rectangles—see FIG. 1 for an illustration of these elements). The edges of the hexahedrons are co-incident with the edges between the nodes of the mesh. In a simple model, the nodes of the mesh may be regularly spaced to define cubic elements. It is not necessary, however, for the nodes to be evenly spaced in all finite element models. A variety of different sizes and shapes of hexahedral elements can be defined within a single mesh.

One of the problems with meshes that use hexahedron elements is that they do not lend themselves well to modeling complex geometries. In other words, it may be difficult to place nodes sufficiently close to regular surfaces, such as a well bore, to accurately determine a solution to the model along those surfaces. Viewed another way, it is difficult to fill any regularly-shaped object with regularly-shaped boxes. This situation is further complicated by limitations on the minimum distance between nodes in a structured mesh. Even when additional node elements can be defined in the mesh to improve the accuracy of the model, the inclusion of these additional elements causes the resources needed to solve the resulting model to increase. With increased accuracy, a greater number of elements is required, requiring greater computing power to generate a solution.

One way to reduce the cost associated with increasing the accuracy of a finite element model is to use an unstructured mesh, such as that disclosed in related US. Patent Application Publication No. 2002/0032550 entitled, "A METHOD FOR MODELING AN ARBITRARY WELL PATH IN A HYDROCARBON RESERVOIR USING ADAPTIVE MESHING," filed on Jun. 29, 2001 (the "Adaptive Meshing Application"), which is hereby fully incorporated by reference. In an unstructured mesh, the elements that comprise the mesh are not constrained to fit within a predetermined structural scheme. For example, the elements are not required to be selected from a finite set of pre-defined element shapes (e.g., hexahedral) or sizes. More particularly, it may be convenient to employ a mesh that comprises simplex elements that have no pre-defined constraints. The faces of the simplex elements can be oriented to follow the contours of a surface that is being modeled and may, therefore, achieve accuracy that is on par wit a structured mesh having many more elements because the faces of the simplex elements need not be parallel to pre-determined planes. As a result, the unstructured mesh is simpler and can be solved faster and easier. The Adaptive Meshing Application discloses a method for defining the elements of an unstructured mesh such that a surface being modeled is essentially coincident with the faces of the elements in the mesh (or more particularly with some of the element faces), such that the surface can be accurately defined and irregular surfaces can be properly modeled.

However, existing meshing techniques for modeling of physical systems typically represent singularities, such as a well bore within a hydrocarbon reservoir, as a point source. Rather than modeling a well bore in detail, existing methods and systems for modeling of a reservoir system represent the well bore as a single point, a singularity, within the mesh defining a system and use a technique to disperse the singularity away so as not to have to solve the resulting model at the singularity. In essence, prior art methods disperse away this spike in the physical system and distribute it into the neighboring regions to form a homogeneous hump, which is much easier to solve mathematically than if the singularity were modeled with its own mesh. This method works well if the system to be modeled is homogenous around the well bore. Mathematically, if the system is homogenous in the area near the hump, an accurate solution can be obtained. However, the area near a well bore in a hydrocarbon reservoir is typically not homogenous. It is, however, an area of great interest within the drilling and exploration market.

Property variations in the area near the well bore greatly impact the production of a well. Further, properties such as viscosity and flow can change rapidly near the well bore. No matter how large a reservoir is (for example, a reservoir spread out over a 2-acre land area), all of the fluid extracted from the reservoir will go to the surface through a small opening (e.g., a well bore, typically, six inches to a foot in diameter). If the properties around the well bore are very poor, then it will be much more difficult to extract fluid from the reservoir to the surface. Conversely, if the properties around the well bore are good (healthy), then fluid flow to the surface will be much easier. It can be much easier to predict variations in the properties near the well bore and, hence, to predict the production capacity of a well, if the well bore is modeled using a meshing technique then it is using currently existing reservoir-only meshing modeling techniques.

Further, by being able to more accurately predict the properties near the well bore (e.g., about six inches to a few feet out from the well center line), decisions can be made on whether to make certain improvements to the well to improve flow. For example, factors such as erosion around the well bore, and changes to other properties that can affect fluid flow at the well bore, can be compensated for. Erosion and other damage to the well can also be minimized by predicting the effect on some parameter(s) of varying other parameters, such as porosity or fluid flow velocity. Prior art methods do not provide production engineers this ability to accurately determine the conditions at critical points near the well bore. As a result, production from a well may not be optimized and, in fact, well damage may occur more quickly, resulting in a loss of time and money to either abandon a well or to redrill a well.

Prior art methods and systems for modeling reservoirs also do not provide the ability to alter the values of properties in the near well region to predict changes that may occur as a result of such a change. Because existing methods disperse the well bore singularity away and do not provide solutions for within the well bore, property values in the near well bore region cannot be altered to help in predicting the effects of changing well and reservoir parameters, such as flow and extraction rate. Production engineers cannot assign values to properties within the well bore because prior art methods do not provide a mesh having great enough resolution in the near well bore region to allow modeling and alteration of property values within the well bore region.

SUMMARY OF THE INVENTION

Therefore, a need exists for a method and system for high resolution modeling of a well bore in a hydrocarbon reservoir that can be used to more accurately predict the properties in and near the well bore region by providing for a solution within the well bore to a reservoir model within the well bore.

Still further, a need exists for a method and system for high resolution modeling of a well bore in a hydrocarbon reservoir that can provide for alteration of the near well properties to aid in predicting the effects of property value changes to the area within a well bore.

Even further, a need exists for a method and system for high resolution modeling of a well bore in a hydrocarbon reservoir that can be used to more accurately predict the behavior of a well over time and in response to various near well property changes, so as to reduce production costs by providing a means to more accurately create a production strategy that will prolong the life of a well.

Further still, a need exists for a method and system for high resolution modeling of a well bore in a hydrocarbon reservoir that can be used to generate a mesh along the well bore path to model the well bore itself.

One or more of the advantages outlined above may be provided by the various embodiments of the present invention. Broadly speaking, the present invention comprises a method for adapting an unstructured, finite element mesh to accurately model both the surface of a well bore in a region to be modeled, and to accurately model the volume defined by the well bore surface. This method may provide a number of advantages over prior art methods, including increasing the accuracy and resolution of a model, simplifying the model, eliminating the need to use special functions to approximate the behavior of features such as the well bore, and providing a solution for the model within the space defined by a well bore surface.

In one embodiment, the method of this invention comprises constructing a first unstructured mesh, having a plurality of n-dimensional simplices, corresponding to a first modeled system (space), defining a surface bounding a second modeled space, identifying a subset of the plurality of n-dimensional simplices of the first mesh that are intersected by the surface, and modifying the subset of simplices so as to adapt the first mesh such that it comprises a second mesh and a third mesh, wherein the second mesh comprises a set of simplices located entirely interior to the surface and wherein the third mesh comprises another set of simplices located entirely exterior to said surface. In this way, new elements are defined within the intersected elements such that one or more of the faces of the new elements are substantially coincident with said surface (that is, they lie approximately on the surface), and such that some of said new elements lie entirely within the volume defined by said surface, and other elements entirely outside of said volume.

More specifically, for each element that is intersected by the surface, a set of points at which the faces, edges or vertices of the element are intersected by the surface is determined (if the element is only intersected at a single point, it need not be subdivided into two or more new elements). At each point of intersection, a new node is created (if the point of intersection is not a node) and two new elements that incorporate the new node are generated. This process is performed for each point of intersection to subdivide the intersected element into a number of new simplex elements, some of which comprise faces that lie substantially on the modeled surface.

Another embodiment of the method of this invention is a method for modeling a well bore in a three-dimensional reservoir, comprising the steps of defining a plurality of two-dimensional boundaries of the reservoir, generating a two-dimensional surface triangulation mesh on one or more of the reservoir boundaries, defining the well bore within the reservoir, wherein the well bore comprises an isosurface within the reservoir, constructing a well-bore mesh, having a plurality of three-dimensional simplices, corresponding to the well bore, wherein a plurality of triangular faces of a subset of the simplices form a well bore surface triangulation and lie substantially coincident with the well bore isosurface, and constructing a reservoir mesh from the surface triangulation to fill the reservoir.

Various alternative embodiments are also possible. These may include software or formal applications that embody methods such as those described herein, as well as computer readable media containing such applications and computers or other data processing systems that are configured to perform the described methods.

BRIEF DESCRIPTION OF THE DRAWINGS

A more complete understanding of the present invention and the advantages thereof may be acquired by referring to the following description, taken in conjunction with the accompanying drawings in which like reference numbers indicate like features and wherein.

Figure 1:
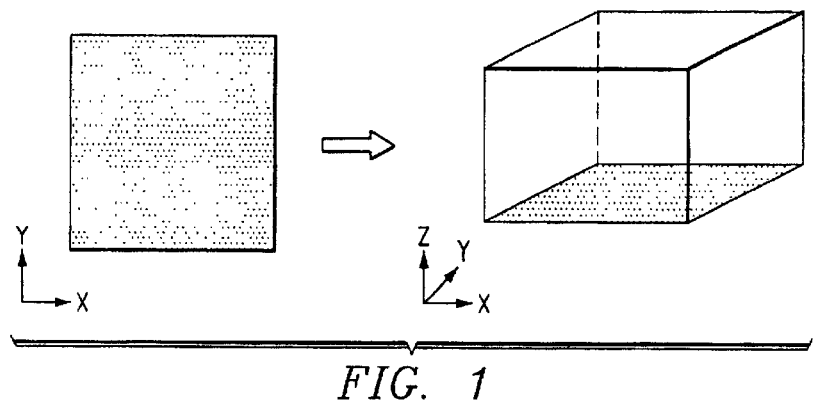
FIG. 1 is an illustration of the rectangular and hexahedral elements which comprise structured finite element meshes in the prior art.

While the invention is subject to various modifications and alternative forms, specific embodiments thereof are shown by way of example in the drawing and the accompanying detailed description. It should be understood, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF THE INVENTION

Preferred embodiments of the present invention are illustrated in the FIGUREs, like numerals being used to refer to like and corresponding parts of the various drawings. It should be noted that the embodiments of the present invention described below are exemplary and are intended to be illustrative of the invention rather than limiting.

The embodiments of the present method and system are directed generally to constructing and solving finite element models. More particularly, they are directed to the construction of finite element meshes and the refinement of these meshes so as to generate high resolution models of the interior of a surface defining a well bore, as well as of the volume of a reservoir in which the well bore may be located, such that the faces of some of the elements in the reservoir mesh are essentially coincident with the surface defining the well bore.

Broadly speaking, one embodiment of the present method comprises constructing an initial unstructured mesh of simplex elements filling a reservoir volume, defining a well bore trajectory within the reservoir, defining a well bore radius around said trajectory to define a surface a radial distance out from said trajectory enclosing the trajectory to form the well bore surface within said mesh, identifying intersections between the elements of the mesh and the well bore surface to be modeled, then redefining the intersected elements exterior to said surface to comprise faces coincident with the well bore surface, and to comprise new elements within the well bore surface defining a well bore mesh with some elements likewise having faces coincident with the well bore surface. More particularly, new nodes are located at the point of intersection and are used as the basis for subdividing the initial elements into new elements both within the well bore surface and outside of the well bore surface. The number of new elements that are created for a particular element depends upon the manner in which the surface intersects that element. The new elements are created in such a way that each is a simplex in the modeled space. The present method is employed in the generation of multidimensional finite element models. It should be noted that, while the examples described below include only 2- and three-dimensional meshes, the method is generally applicable in n dimensions.

It may be helpful before describing the present method in detail to define a few terms relating to finite element meshes:

A node is a point in space. In finite element modeling, nodes form the vertices of the elements that are modeled. The nodes also form part of a mesh of nodes and edges that define the boundaries between elements in the modeled space.

An edge is a line between two nodes that forms vertices of an element. The edges form part of the mesh that defines the boundaries between elements in the modeled space.

A simplex is a spatial configuration of n dimensions determined by n+1 in a space of dimension equal to or greater than n. In other words, a simplex is a geometric spatial element having the minimum number of boundary points necessary to enclose a space in a given number of dimensions. For example, in two dimensions, a simplex comprises a triangle, together with the interior area bounded by the triangle (see FIG. 6). Two points are insufficient to form a simplex in two-dimensional space because no area is bounded by the points (and the lines that interconnect them.) While four points may be sufficient to bound a two-dimensional area, they do not comprise the minimum number of boundary points by which the two-dimensional area can be bounded. In three dimensions, a simplex comprises a tetrahedron, which is bounded by four vertices (see FIG. 6.) In four dimensions, a simplex comprises a hypertetrahedron (sometimes referred to as a hypertet) having five vertices.

A face is an (n−1)-dimensional surface of an n-dimensional element. For example, in a two-dimensional element, each of the lines that bounds the area of the element is a face of that element. In a three-dimensional element, each of the two-dimensional surfaces that bound the volume of the element is a face of that element. Preferably, the faces of at least some of the elements in a finite element model are located so that they are coincident with surfaces or boundaries within the modeled space.

A mesh is a collection of elements that fill a modeled space. These elements are representative of a system that resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

Some embodiments of the method and system of this invention have as a first step the generation of a mesh to model a reservoir in which will be located a well bore. This first step of generating the reservoir mesh can be accomplished by any of a variety of known methods, and in particular, using the method described in the Adaptive Meshing Application referenced above. A description of this method of mesh generation is included below for ease of illustration. Another technique for generating a reservoir mesh in three dimensions is to extrude a two-dimensional mesh in the manner disclosed in related U.S. Pat. No. 6,674,432 entitled, "METHOD AND SYSTEM FOR MODELING GEOLOGICAL STRUCTURE USING AN UNSTRUCTURED FOUR-DIMENSIONAL MESH" filed on Jun. 29, 2001 (the "Extruding Application"). This application is hereby fully incorporated by reference.

An embodiment of the method and system of this application comprises generating a reservoir mesh and then defining a well bore trajectory within the reservoir mesh. The well bore trajectory can be provided as an input to an algorithm comprising an embodiment of the system of this invention. The reservoir mesh likewise can be pre-generated and provided as an input. A value for the radius of the well bore from the center line of the trajectory is also provided. Further, a datum point can be provided as an input to be a reference point for the coordinate system used for the model.

Embodiments of the method and system of this invention can comprise defining the trajectory of the well bore, and the surface defined by a radius from the well bore center line, implicitly after taking as an input the generated reservoir mesh. Other embodiments generate a well bore and mesh explicitly by defining the well bore center line, the radius of the surface from the center line and generating a mesh within the well bore. In an explicitly generated well bore mesh embodiment, a next step can be to construct the reservoir mesh around the well bore mesh by any of the previously discussed methods, or by other methods such as the commercially available Inria meshing algorithm. The Inria algorithm can take as inputs one or more two-dimensional boundaries for the system being modeled and can generate a three-dimensional mesh based on a provided two-dimensional mesh of the system boundary(s).

Figure 2:
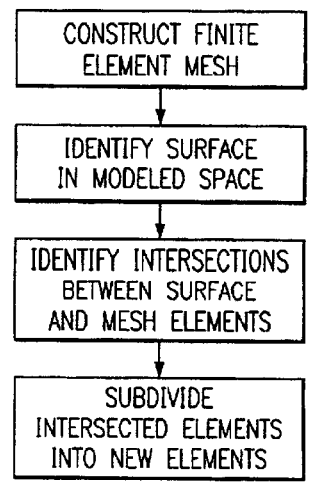
FIG. 2 is a flow diagram illustrating the basic steps of one embodiment of the present method.

Referring to FIG. 2, a flow diagram illustrating the basic steps of one aspect of an embodiment of the method of this invention is shown. Generally speaking, the adaptive meshing method comprises constructing an unstructured mesh corresponding to a space (e.g., a reservoir) that is being modeled, then identifying a surface in the modeled space (e.g., a well bore outer surface) and determining the intersections of the surface with the elements of the mesh, and finally defining new elements within the intersected elements so that one or more of the faces of the new elements are substantially coincident with the surface. ("Substantially coincident" is used herein to refer to element edges or faces for which the corresponding nodes lie on a curve or surface.) These faces approximate the modeled surface.

Each element in the mesh has a corresponding set of nodes that comprise the vertices of the element. Likewise, each element has a corresponding set of edges that connect the vertices. In the embodiments of the method of this invention, the intersection of a surface with an element is characterized by the points at which the surface intersects with the nodes and/or edges of the element. Consequently, identifying the intersection of a surface with the element comprises determining the points at which the surface intersects the nodes and/or edges. These points of intersection are then used as nodes for two or more newly defined elements. The new elements effectively include the intersecting portion of the surface as one of the faces of the new elements.

Figure 3A:
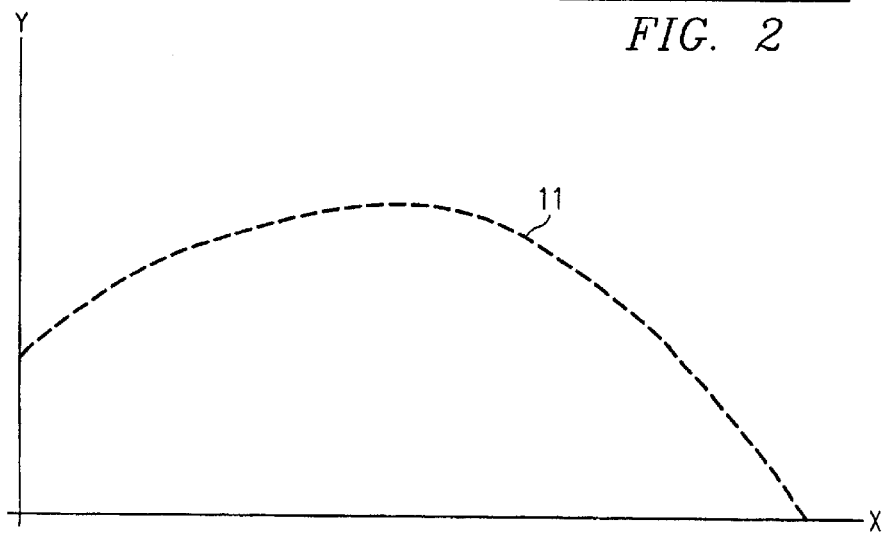
FIGS. 3A–3B are illustrations of a curve in two-dimensional space and an initial unstructured mesh that could be used as the basis for modeling the curve.
Figure 3B:
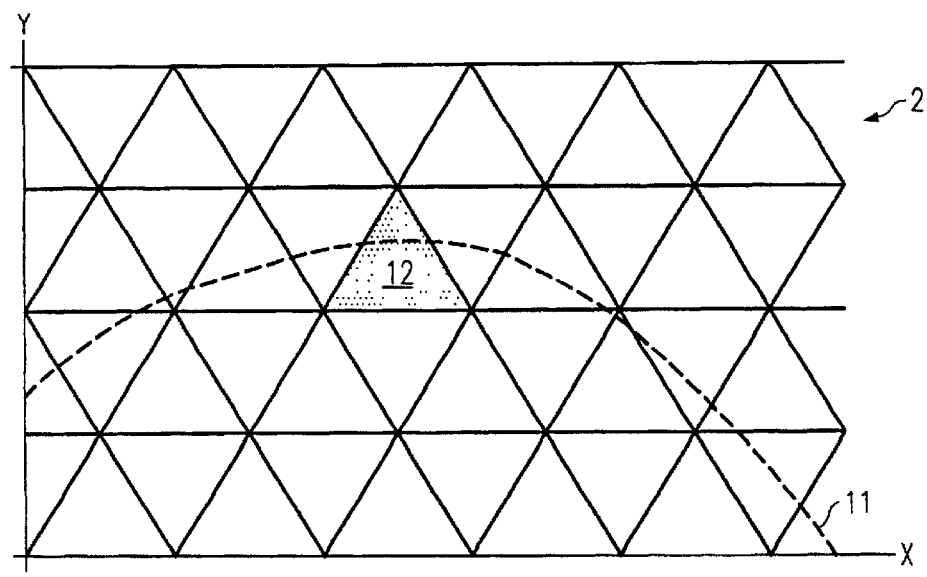

A two-dimensional example is illustrated in FIGS. 3–4. FIG. 3A shows a curve 11 which represents a surface in two-dimensional space. FIG. 3B shows a two-dimensional mesh 2 constructed to model the space containing curve 11. Mesh 2 comprises a series of triangular elements that are simplexes in two-dimensional space. One of the elements, identified by reference numeral 12, is highlighted—this element will be referred to in the following description of the manner in which the elements are subdivided. Although the elements in this initial mesh 2 are regular, it should be noted that the mesh is unstructured, and the elements may have any suitable size or shape (keeping in mind that they must be simplexes.) Curve 11 is also shown in FIG. 3B.

It can be seen that the elements of initial mesh 2 do not follow curve 11. In other words, curve 11 does not lie substantially along the edges of the elements. Instead, curve 11 intersects a number of the elements, traversing some path across the space bounded by these elements. Because it is desired to construct a mesh in which the faces of the elements coincide with curve 11, it is necessary to modify or refine mesh 2. In the present embodiment, this is accomplished by effectively adding edges that lie on curve 11 (subdividing the existing elements into new elements that include the added edges.)

Figure 4A:
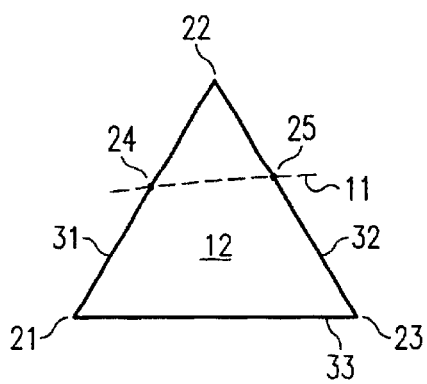
FIGS. 4A–4C are a set of diagrams illustrating the manner in which an element of the unstructured mesh of FIG. 3B is subdivided into sub-elements which can more accurately model the curve which intersects the original element.
Figure 4B:
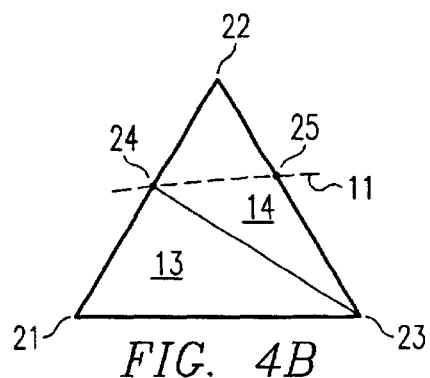
Figure 4C:
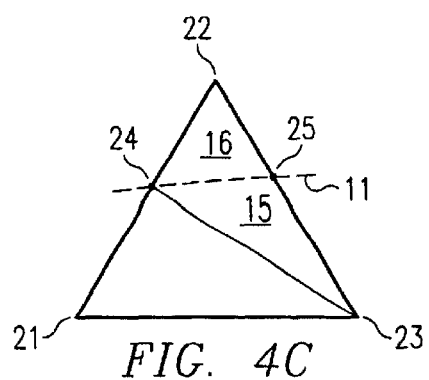

Referring to FIGS. 4A–4C, element 12 is shown apart from the mesh. A portion of curve 11 that intersects element 12 is also shown in FIG. 4A. Element 12 is defined by the three points (21, 22, 23) that form its vertices. The area within element 12 is bounded by the edges (31, 32, 33) that connect the vertices. As indicated above, it is necessary to identify the intersections between curve 11 and edges 31, 32 and 33. It is a relatively straightforward matter to calculate the intersections between curve 11 and the edges of an element 12 based upon the mathematical representation of each. It can be seen from FIG. 4A that curve 11 intersects edge 31 at point 24. Likewise, curve 11 intersects edge 32 at point 25.

An edge connecting points 24 and 25 would be substantially coincident with curve 11 in the space covered by element 12. That is, an edge connecting points 24 and 25 would closely approximate the portion of curve 11 that traverses element 12. Creation of an edge between points 24 and 25, however, would not, without more, be a sufficient refinement of the mesh because this would divide element 12 into a triangular area and a second area bounded by an irregular quadrilateral, which is not a simplex in two-dimensional space. The space covered by the quadrilateral must therefore be subdivided into simplexes (triangular elements.)

Referring to FIGS. 4B and 4C, the manner in which element 12 is subdivided into a plurality of new simplex elements is illustrated. Once the locations of points 24 and 25 are identified, element 12 is subdivided as follows: first, a node is placed at point 24 and an edge is created between this node and the opposite vertex of element 12 (point 23.) ("Opposite," as used here, refers to the vertex that is opposite the edge (31) on which the new node is located.) This creates new elements 13 and 14. Element 13 is defined by vertices at points 21, 23 and 24, while element 14 is defined by vertices at points 22, 23 and 24. A node is then placed at point 25 and an edge is created between this node and the node at point 24 (the opposite vertex of element 14.) This edge forms a segment of the modeled curve 11. As shown in FIG. 4C, the addition of this edge results in the creation of new elements 15 and 16. Element 15 is defined by vertices at points 23, 24 and 25, while element 16 is defined by vertices at points 22, 24 and 25.

Now, instead of having a single simplex element 12 that is intersected by curve 11 (and that does not have a face coincident with curve 11), there are three new elements (13, 15 and 16) each of which is still a simplex in two-dimensional space, and two of which share a face that lies on curve 11. This same process can be repeated with each of the original mesh 2 elements so that an edge is created wherever curve 11 traverses one of the elements. The result is an unstructured mesh of simplex elements that have edges that closely approximate the path of curve 11 and consequently enable the accurate modeling of the surface represented by curve 11.

Figure 5:
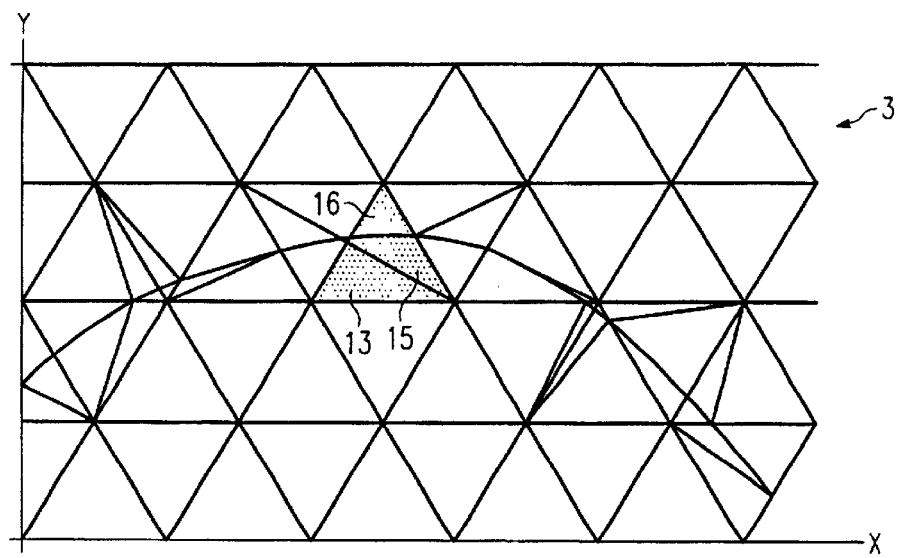
FIG. 5 is an illustration of a refined mesh which is adapted to model the curve shown in FIGS. 3A and 3B.

Referring to FIG. 5, the refined mesh 3 generated by applying the foregoing adaptive meshing method to each of the intersected elements of FIG. 3B is shown. The edges of the new simplexes that are substantially coincident with curve 11 are shown in heavy lines so they can be easily seen. It is apparent from FIG. 5 that the new edges provide a close approximation of the original curve 11. Curve 11 may be matched even more closely if mesh 2 is refined to use smaller elements before the adaptive meshing method of this invention is applied.

While each of the intersected elements of mesh 2 illustrated in FIG. 3B was intersected by curve 11 from one edge to another, it should be noted that the elements could also have been intersected at a node and an edge. That is, for a particular element, curve 11 could have traversed the element between one of its nodes and the opposite edge. In this case, it would only be necessary to make a single subdivision of the element by creating a new node where the curve intersects the edge, and then defining each of the new elements to include the intersected node, the new node, and one of the remaining nodes. For example, in the example of FIGS. 4A and 4B, if the curve had traversed the element from point 24 to point 23, a new edge between these points (and resulting elements 13 and 14) would have been sufficient.

There are actually two other cases that may be encountered. In one case, the surface may intersect only a single node of a simplex element. Because this node lies on the surface, there is no need to refine the element further. The surface may also intersect the element at two nodes. In this instance, the edge of the element already lies on the surface to be modeled, so no refinement of the element is necessary. (It should be noted that the identification of the type of intersection between the element and the surface may be regarded as a separate step of the method.)

The foregoing example is a very simple illustration of one embodiment of the adaptive meshing steps of the present invention in the context of a two-dimensional mesh. The more complex case of a three-dimensional mesh is illustrated below. Meshes of three and four dimensions are of particular interest in modeling physical systems over time. Because of the difficulty of illustrating four-dimensional systems, only the three-dimensional case will be described in detail below. The description of the three-dimensional case illustrates the manner in which the method can be extended to additional dimensions.

Figure 6:
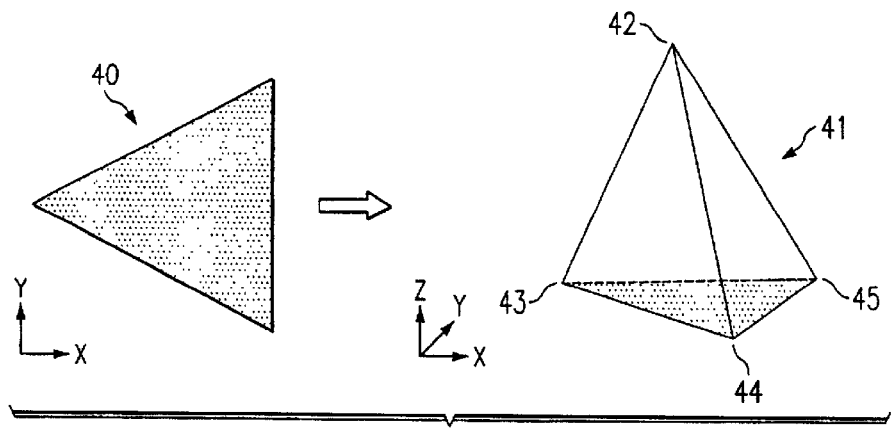
FIG. 6 is a diagram illustrating a three-dimensional simplex 41 in comparison with a two-dimensional simplex.

Referring to FIG. 6, a three-dimensional simplex 41 is shown in comparison to a two-dimensional simplex 40. Three-dimensional simplex 41 is defined by four vertices 42–45 and is bounded by the edges and faces between them. The application of the adaptive meshing algorithm of the present invention is more complicated in the three-dimensional case than in the two-dimensional case. One added complexity arises from the need to calculate the intersection of a three-dimensional surface with a three-dimensional element. While this requires additional computing power with respect to the two-dimensional case, it is still relatively straightforward. Another complexity is that the intersection of a surface and a simplex may involve four different cases that could necessitate the subdividing of the simplex: intersecting one node and two edges; intersecting two nodes and one edge; intersecting three edges; or intersecting four edges. Each of these cases is handled differently. (Remember that a curve in two dimensions can also intersect a simplex at one, two or three nodes, although no subdivision of the simplex would be required in these instances.)

Although more complex, the adaptive meshing steps of the method of this invention applied to three-dimensional meshes is generally the same as in the two-dimensional case—an initial mesh is constructed, a surface is identified, the intersections between the surface and the nodes/edges of the elements are identified, and the elements are subdivided using the intersections as nodes in the new elements. The three-dimensional method differs in that the step of subdividing an element is handled a bit differently for each of the four different types of intersections. (It should be noted that the present methods can be extended to four or more dimensions, but such cases will not be described here because of the difficulty of illustrating them clearly.)

Figure 7A:
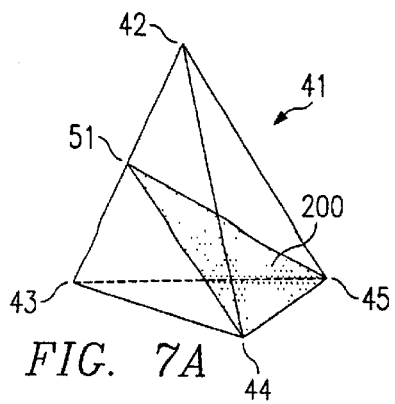
FIGS. 7A–7D are a set of diagrams illustrating the possible types of intersections between an approximately planar surface and a three-dimensional simplex.
Figure 7B:
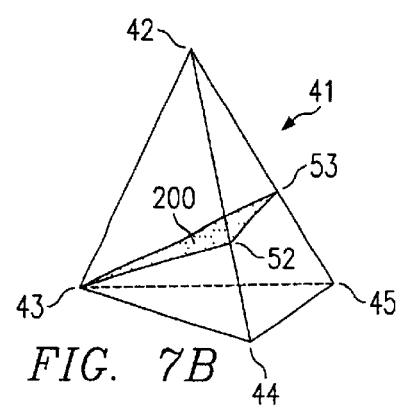
Figure 7C:
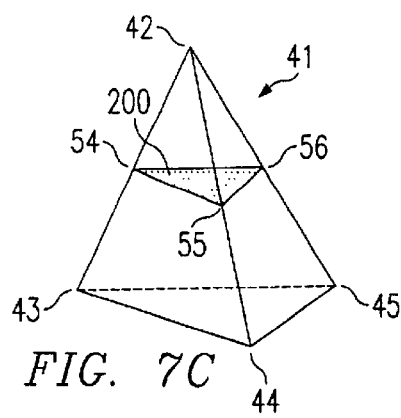
Figure 7D:
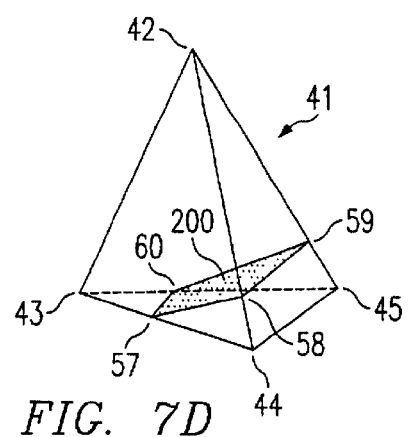

The four different types of intersections in three dimensions are illustrated in FIGS. 7A–7D. Each figure depicts the three-dimensional simplex element 41 of FIG. 6 intersected by a surface 200 having a different orientation. The shaded portion of each figure represents the portion of the surface 200 that intersects element 41. FIG. 7A shows the intersection of element 41 at two nodes (44 and 45) and one edge (51). FIG. 7B shows the intersection of element 41 at one node (43) and two edges (52 and 53). FIG. 7C shows the intersection of element 41 at three edges (54–56). Finally, FIG. 7D shows the intersection of element 41 at four edges (57–60). (It should be noted that surface 200 may also intersect the three-dimensional element 41 at one, two or three nodes. In the first two of these cases, surface 200 does not traverse element 41 and no subdivision of element 41 is necessary. In the third case, the face of element 41 already lies on the surface 200 and no further action needs to be taken.)

Referring to the intersection depicted in FIG. 7A, where the surface intersects the element at two nodes and one edge, the element is subdivided by creating a face between the two nodes (44 and 45) and the point of intersection on the edge (51). (A new node is located at the intersection point 51.) This results in the creation of two tetrahedra with the vertices {43, 44, 45, 51} and {42, 44, 45, 51}. Newly created face {44, 45, 51} is a facet of the surface which is being modeled.

Figure 8A:
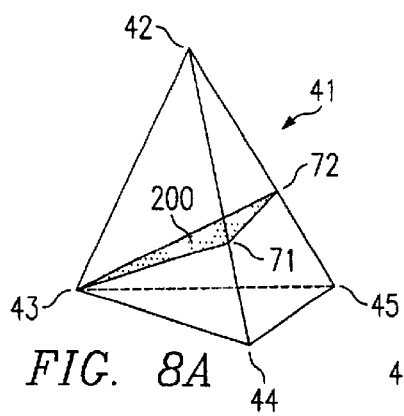
FIGS. 8A–8C are a set of diagrams illustrating the manner in which an the three-dimensional simplex of FIG. 7B is subdivided into sub-elements based upon its intersection by an approximately planar surface at one node and two edges.
Figure 8B:
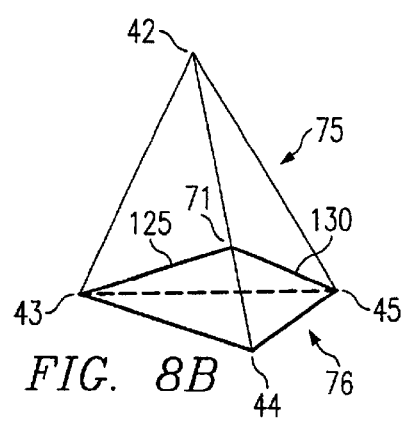
Figure 8C:
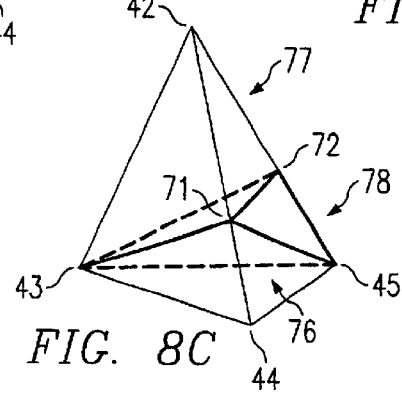

Referring to the intersection depicted in FIG. 7B, surface 200 intersects element 41 at one node and two edges. FIG. 7B is repeated as FIG. 8A for the convenience of the reader. The points of intersection with the edges of element 41 are indicated by reference numerals 71 and 72. The first step in subdividing element 41 is to select one of the points of intersection and to locate a node at that point. In this example, point 71 is selected. As shown in FIG. 8B, two new simplex elements, indicated by reference numerals 75 and 76, can be created using this new node by creating new edges 125 and 130 from it to the nodes at the vertices opposite from point 71. The first new element, 75, has vertices at {42, 43, 45, 71} and the second element, 76, has vertices at {43, 44, 45, 71}. The next step is to place a node at the remaining point of intersection (72). This node is used as the basis for subdividing element 75 into new elements 77 and 78 (see FIG. 8C.) Element 77 has vertices at {42, 43, 71, 72} and element 78 has vertices at {43, 45, 71, 72}. Thus, the subdivision of element 41 in this case results in the creation of new elements 76, 77 and 78. The face which separates elements 77 and 78 forms a face that is substantially coincident with the modeled surface 200. Element 41 is subdivided so as to create the minimum number of simplex elements, with nodes at each of the points of intersection, and such that the intersecting surface 200 is substantially coincident with the face of a new element.

Figure 9A:
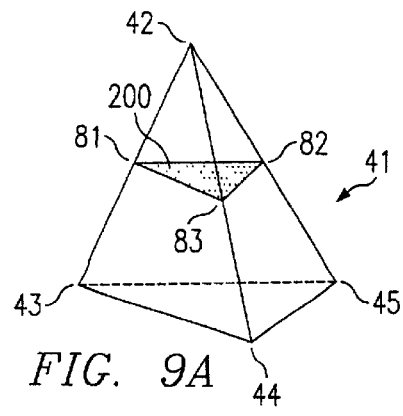
FIGS. 9A–9D are a set of diagrams illustrating the manner in which an the three-dimensional simplex of FIG. 7C is subdivided into sub-elements based upon its intersection by an approximately planar surface at three edges.
Figure 9B:
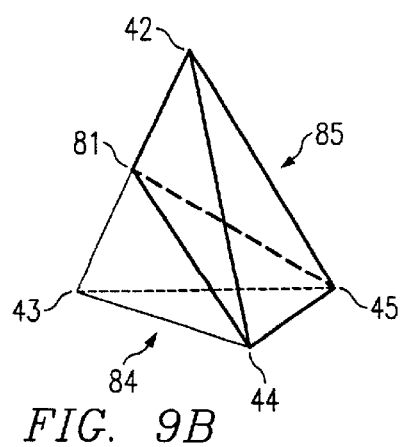
Figure 9C:
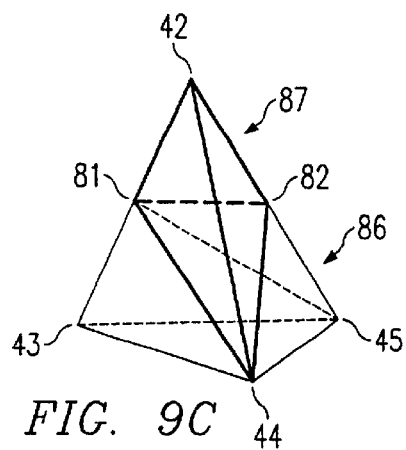
Figure 9D:
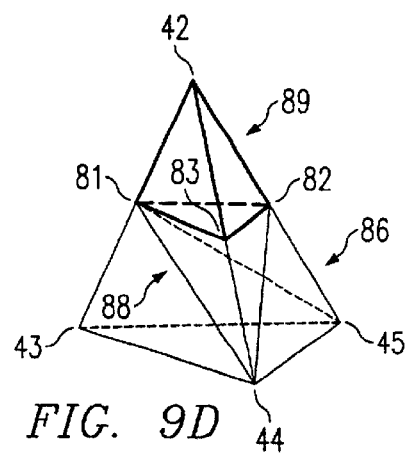

Referring to the intersection depicted in FIG. 7C, surface 200 intersects three edges of element 41. FIG. 7C is repeated as FIG. 9A for the convenience of the reader. The points of intersection between surface 200 and element 41 are indicated by reference numerals 81, 82 and 83. The process of subdividing element 41 in this case is very similar to the previous case—nodes are sequentially located at the points of intersection and new elements are created based on the addition of each node and edges from each new node to the vertices opposite from each new node along a face on which the new node lies. For example, as shown in FIG. 9B, a first node is located at point 81, creating elements 84 and 85. Element 84 has vertices at {43, 44, 45, 81} and element 85 has vertices at {42, 44, 45, 81}. Then, a node can be placed at the next point of intersection (82). This node is used to subdivide element 85, creating new elements 86 and 87, as shown in FIG. 9C. Element 86 has vertices at {44, 45, 81, 82} and element 87 has vertices at {42, 44, 81, 82}. Finally, a node is placed at the last point of intersection (83). Using this node, element 87 is subdivided into new elements 88 and 89, as indicated in FIG. 9D. Element 88 has vertices at {44, 81, 82, 83} and element 89 has vertices at {42, 81, 82, 83}. Thus, in this case, element 41 is subdivided into four new elements—84, 86, 88 and 89. The face which separates elements 88 and 89 forms a facet of the intersecting surface 200 and is substantially coincident with surface 200.

Figure 10A:
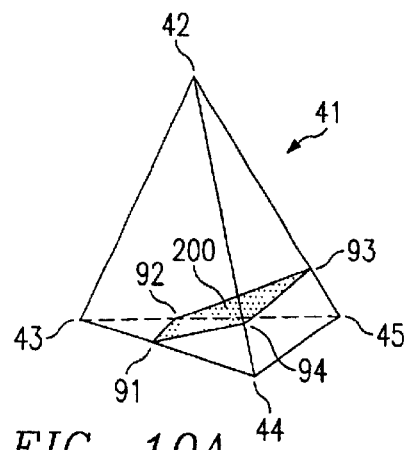
FIGS. 10A–10C are a set of diagrams illustrating the manner in which an the three-dimensional simplex of FIG. 7C is subdivided into two sub-elements based upon its intersection by an approximately planar surface at four edges.
Figure 10B:
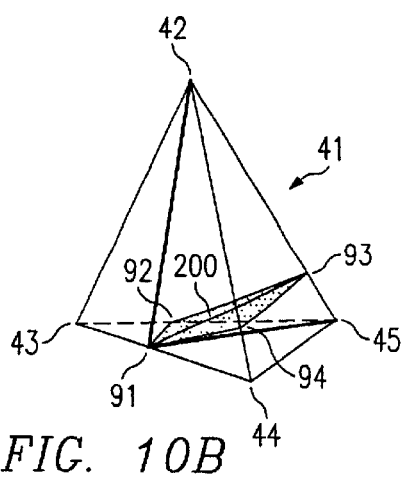
Figure 10C:
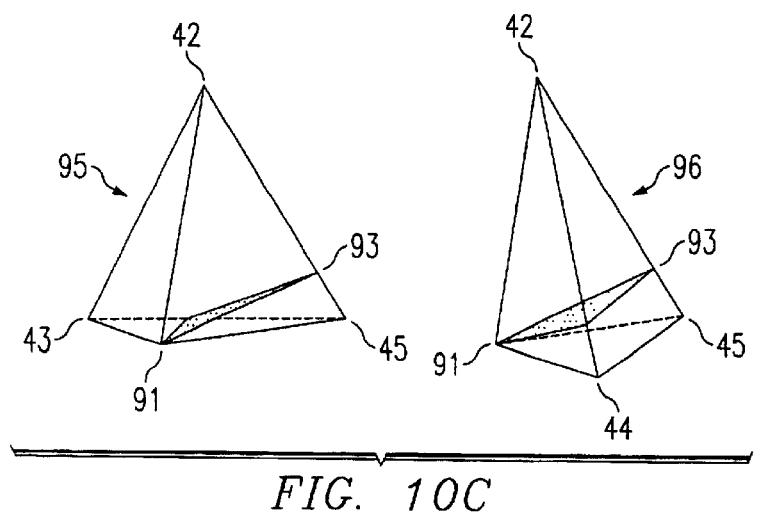

Referring to the intersection depicted in FIG. 7D, the surface intersects four edges of element 41. FIG. 7D is repeated as FIG. 10A for the convenience of the reader. The points of intersection between surface 200 and element 41 are indicated by reference numerals 91, 92 93 and 94. The subdivision of element 41 is illustrated in FIGS. 10A–10C, 11A–11C and 12A–12C. It should be noted that the first step in subdividing element 41 creates two new elements, 95 and 96, each of which is intersected by surface 200 at one node and two edges. This is illustrated in FIGS. 10B–10C. Each of these new elements can then be subdivided in the manner illustrated in FIGS. 7B–7C. The subdivision of elements 95 and 96 is shown in FIGS. 11A–11C and 12A–12C.

Figure 11A:
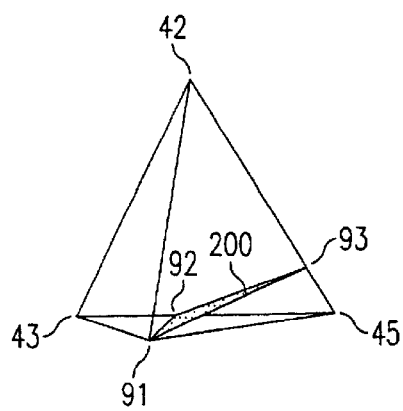
FIGS. 11A–11C are a set of diagrams illustrating the manner in which a first one of the sub-elements of FIG. 10C is further subdivided into sub-elements.
Figure 11B:
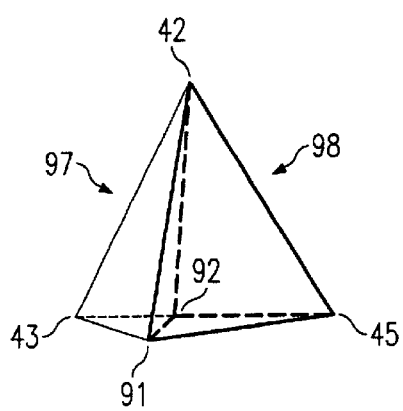
Figure 11C:
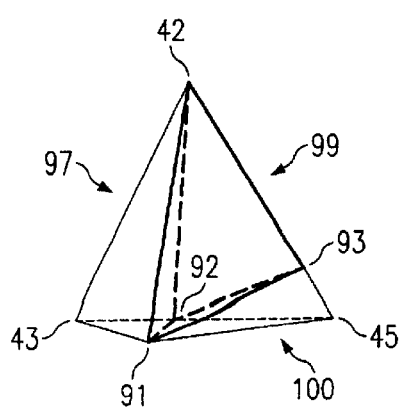

Referring to FIGS. 11A–11C, the subdivision of element 95 is illustrated. First, a node is placed at point 92, and two new elements incorporating this node are created. These are elements 97 and 98. The vertices of element 97 are at {42, 43, 91, 92} and the vertices of element 98 are at {42, 45, 91, 92}. Then, a node is placed at point 93. Based on this new node, element 98 is broken down into two new elements, 99 and 100. Element 99 has vertices at {42, 91, 92, 93} and element 100 has vertices at {45, 91, 92, 93}. The face of elements 99 and 100 which is formed between points 91, 92 and 93 forms a facet of the modeled surface 200.

Figure 12A:
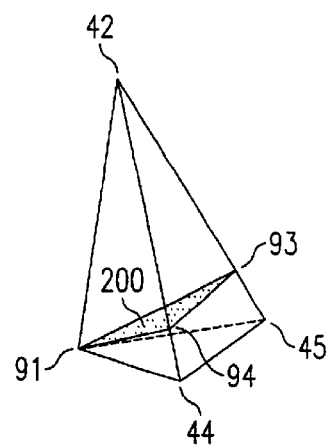
FIGS. 12A–12C are a set of diagrams illustrating the manner in which the second one of the sub-elements of FIG. 10C is further subdivided into sub-elements.
Figure 12B:
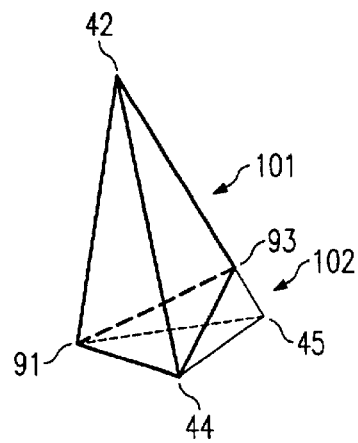
Figure 12C:
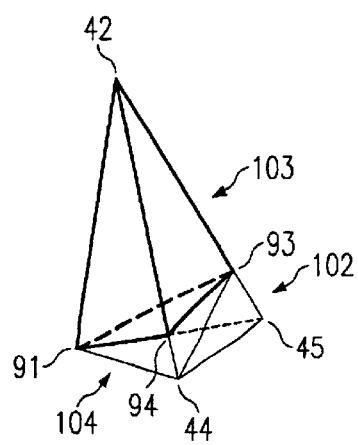

Referring to FIGS. 12A–12C, the subdivision of element 96 is illustrated. The first step is to place a node at point 93. Based on this node, two new elements are created. These elements are indicated by the reference numerals 101 and 102. The vertices of element 101 are at {42, 44, 91, 93} and the vertices of element 102 are at {44, 45, 91, 93}. Next, a node is placed at point 94. Using this new node, element 101 is broken down into two new elements, 103 and 104. Element 103 has vertices at {42, 91, 93, 94} and element 104 has vertices at {44, 91, 93, 94}. The common face of elements 103 and 104 which lies between points 91, 93 and 94 forms another facet of the modeled surface.

One application of the adaptive meshing steps of this invention described above involves the modeling of a well bore that follows an arbitrary path through a reservoir. In prior art systems, well bores were typically assumed to be aligned with the structured mesh which was used to model the reservoir. Then, functions approximating the behavior of the reservoir in the vicinity of the well bore were used for the elements containing the well bore when the model was solved. Generally speaking, these functions do not model the well bore as accurately as if the well bore surface were represented by the faces of the mesh elements and the well bore volume itself were modeled with a mesh. These prior art methods were not at all well suited to modeling well bores having arbitrary paths.

The embodiments of the method and system of the present invention can be used to accurately model a well bore in a reservoir by refining the elements of a finite element mesh to define element faces that are substantially coincident with a well bore surface defined by a predetermined radius from the well bore centerline. This is true even if the well bore follows an arbitrary path through the reservoir. The well bore surface is simply defined mathematically, and then the mesh is refined as described above. Further, in the same manner, the embodiments of this invention generate a mesh within the volume defined by the well bore surface to model the well bore with a greater resolution than previous such methods and systems.

In one embodiment, a well bore is defined implicitly by providing as inputs a reservoir mesh, a well bore trajectory and a well bore radius. The well bore trajectory is the path of the well bore through the reservoir and can comprise a set of connected points that are ordered by measured depth within the reservoir. The radius is a predetermined value for the radius of the well bore. The well bore surface can therefore be characterized mathematically in one embodiment by a function $F(x, y, z)-r=0$, where $F(x, y, z)$ is the distance from a point in the reservoir to the trajectory of the well bore and r is the radius of the well bore. For each of the edges in the finite element reservoir mesh, or a portion of the edges that are within the vicinity of the well bore, intersections with the defined well bore surface are identified. The points at which the edges are intersected by the well bore surface are marked for refinement. The elements containing the marked edges are then refined as described above. It should be noted that the elements for which four edges are intersected can be refined first to improve computational performance. In order to maintain surface preservation, no adjacent elements having four intersected edges are refined in a single pass. If such adjacent elements are identified, one is identified for default to a subsequent refinement pass of the algorithm of this invention. It may, therefore, take several passes to complete the refinement of these elements. Once the elements having four intersection edges are refined, the remainder of the intersected elements can be refined in a single pass.

It should be noted that the reservoir mesh elements intersected by the well bore surface are subdivided according to the teachings of this invention such that some newly created mesh elements exist entirely outside of the volume bounded by the well bore surface and others entirely within the volume bounded by the well bore surface, but none of the elements of the initial mesh remain intersected by the well bore surface. In this way, a separate well bore mesh is defined for which the properties at different nodes can be separately determined (and altered) to aid in predicting behavior within the well bore itself, independently of the rest of the reservoir. The steps of creating a well bore mesh within the well bore volume can be embodied as a distinct algorithm from that used to create the initial reservoir mesh. Both sets of steps, however, or the algorithms embodying those steps, can be combined to form a single executable software program and method.

Because the path of the well bore through the reservoir can be arbitrary, it is necessary to define a coordinate system that is convenient for both defining the well bore and identifying the intersection of the well bore surface with the elements of the reservoir mesh. In one embodiment, a coordinate system that tracks the path of the well bore can be used. This coordinate system identifies points along the well bore using the measured depth in the well bore, an angular distance from a normal vector, and a radial distance from the center of the well bore.

The well bore path can be assumed to comprise a series of segments, each of which is essentially straight. Adjacent segments are joined at joints to form a continuous well path. Because adjacent segments are not coaxial, the coordinate system must account for the fact that some points near the joints may not be well defined. (That is, the coordinate system defined with respect to adjacent segments may overlap on one side of the joint and may not cover all points on the opposite side of the joint.) Consequently, a region corresponding to each segment is defined so that the region extends to a bisecting plane between that segment and an adjacent segment. This eliminates overlapped or undefined areas. (It should be noted that, for a segment at the end of the well bore, the end of the segment region near to an adjacent segment is bounded by the bisecting plane between the segments, but the other end of the segment region is bounded by a plane normal to the trajectory of the segment.)

As indicated above, the coordinate system for each segment includes a measured depth, an angular distance from a normal vector and a radial distance from the path of the well bore. The measured depth of points on the trajectory itself are well-defined. The measured depth of points which are on the inside or outside of curves in the trajectory, however, are not so well-defined. Consequently, the following method for determining the measured depth of these points can be imposed on the system.

Figure 13:
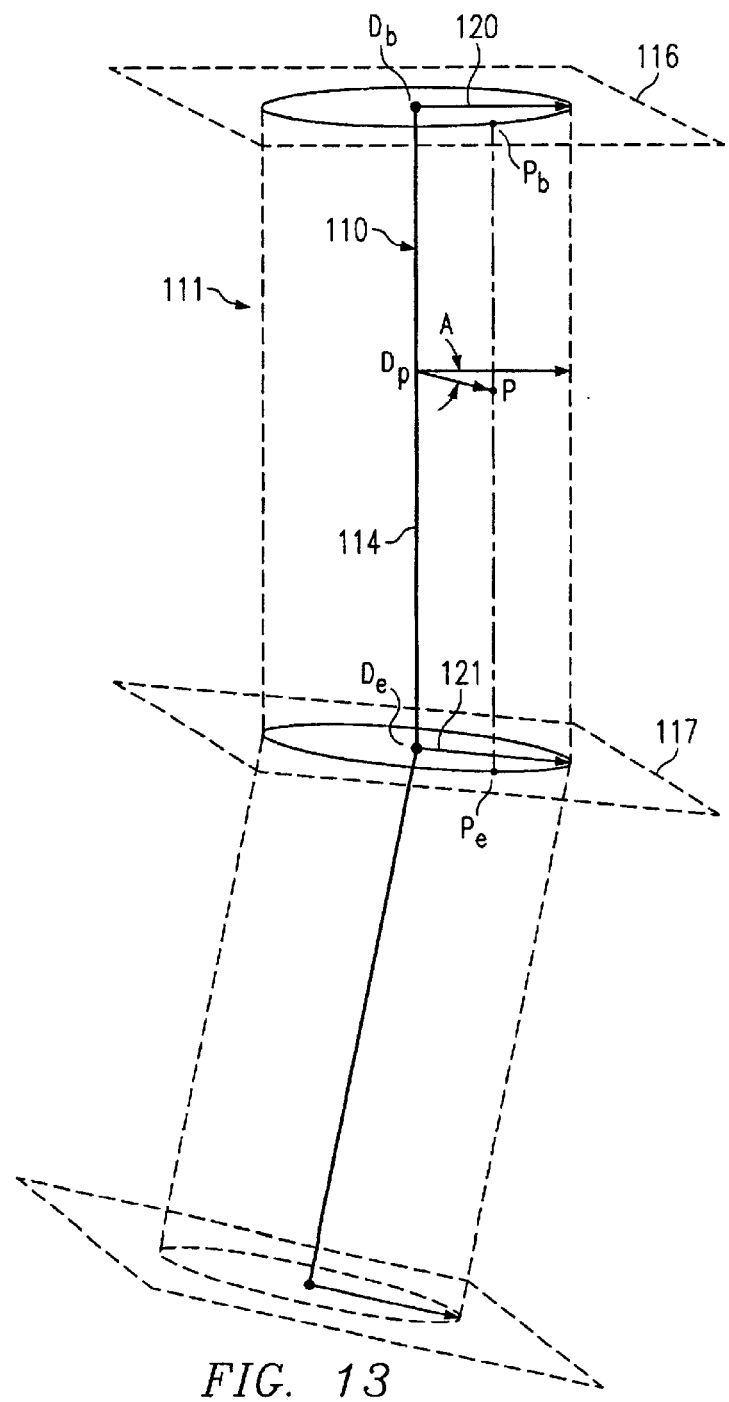
FIG. 13 is a diagram illustrating a well bore trajectory and the well bore surface defined by the trajectory.

Referring to FIG. 13, a diagram illustrating a well bore trajectory 110 and the well bore surface 111 defined by the trajectory is shown. A segment trajectory 114 has a beginning depth $D_b$ and an ending depth $D_e$. For a given point P in the segment, the point is first projected onto the bisecting (or terminating) planes 116, 117 at the ends of the segment. The projection at the beginning of the segment can be indicated by $P_b$ and the projection at the end of the segment can be indicated by $P_e$. The distance between these two projections of the point is then mapped onto the distance between the beginning and ending depths of the trajectory. In other words, the measured depth at point P ($D_p$) can be calculated as $D_p = D_b + (P - P_b) \times (D_e - D_b)/(P_e - P_b)$. Thus, effectively, the depth along the well bore trajectory is "stretched" along the outside of curves in the trajectory and "compressed" along the inside of curves in the trajectory.

It should also be noted that the normal vector for a segment may become ill-defined if it is not translated from one segment to another. For example, the trajectory of the well bore may curve so that the trajectory is parallel to the original normal vector. Consequently, the normal vector for each segment of the trajectory is defined as follows. First, at the beginning of the well bore, a normal vector 120 is defined. This vector extends in an arbitrary direction from the well bore trajectory. The normal vector is then projected onto the bisecting plane 117 at the end of the initial segment of the well bore. The projected vector 121 is then carried through to the next segment of the trajectory and made normal to the trajectory in that segment. This process is repeated from segment to segment throughout the well bore. The angular coordinate A of a point in any of the segments can then be measured from the normal vector in the respective segment. The radial distance from the well bore path is calculated in a straightforward manner—it is simply the closest distance from the trajectory of the segment. In one embodiment, each node near the well bore is converted to the well bore coordinate system, and the converted coordinates are stored with the node. Thus, the coordinate transformation is performed only once, and the coordinates of each node are available in the original and transformed coordinate systems.

In the foregoing manner, a well bore having an arbitrary path defined by the trajectory F(x,y,z) and radius r can be characterized in a convenient mathematical form. The nodes of the finite element mesh in the vicinity of the well bore can also be characterized using this same local coordinate system. This facilitates identification of the intersections between the well bore surface and the elements of the reservoir mesh. Once the points of intersection between the elements' edges and the well bore surface are identified, the elements are refined as described above. In this manner, an arbitrary-path well bore can be accurately modeled in an unstructured finite element mesh. It should be noted that another application of the adaptive meshing steps of the embodiments of the method and system of this invention can comprise refining the reservoir and well bore finite element meshes to increase the accuracy of a solution for each mesh. This refinement method and system are disclosed in the related Adaptive Meshing Application referenced above.

In operation, one embodiment of the method of this invention can comprise a user first generating a mesh model of the reservoir and then providing as an input the trajectory of a well bore within the reservoir mesh. The well bore trajectory can be provided by field engineers who know the geometry of the reservoir and the trajectory of the well. For example, a well bore model could be generated prior to actually sinking a well or once a well has already been drilled and is in operation. The well bore trajectory defines the path of the well bore center line. As discussed above, one embodiment of the method and system of this invention implicitly defines a well bore within an existing tetrahedral mesh simulating a reservoir by constructing an isosurface having a radius equal to the well bore radius. The result is a cylindrical surface in the case of a completely vertical well bore. However, more typically, with an arbitrary well path, the well bore surface can be thought of as a series of connecting cylindrical surfaces such as shown in FIG. 13. The cylindrical surfaces are defined by a radius around the well bore trajectory. The well bore trajectory can be defined by as many individual points, interconnected by lines (edges) as needed to achieve a desired resolution. The depth of the well bore can be indicated as a measured depth, corresponding not to an absolute distance from the surface, but rather to the distance traveled along the well bore trajectory. Thus, in a non-completely vertical well bore, the defined well bore surface becomes a curvy cylinder (e.g., a kinked-up vertical cylinder).

As discussed above, the well bore path can be described using a set of X,Y,Z coordinates, where Z can be the measured depth of the well bore. According to one embodiment of the method and system of the present invention, a mesh can be generated inside of the well bore from the existing tetrahedron mesh defining the reservoir, in accordance with the description previously provided. Where the surface defining the well bore intersects the existing tetrahedron of the reservoir mesh, the method of this invention can be used to generate a new tetrahedron mesh completely within the well bore isosurface and distinct from the reservoir mesh outside the isosurface. This way, tetrahedrons that were initially intersected by the well bore isosurface can be subdivided into new tetrahedrons wholly inside and wholly outside the well bore. The well bore surface is thus defined by the shared faces of tetrahedrons totally inside the well bore with those outside of the well bore.

New nodes created in accordance with the teachings of this invention at the isosurface defining the well bore, as well as within the well bore and outside of the well bore, can be used as solution points for the various properties in and around the well bore. It is important to note that the mesh defining the reservoir can be pregenerated by any currently existing meshing methods, including that disclosed in the Adaptive Meshing Application. It is further important to note that in the implicit embodiment of the method of this invention, the step of defining the trajectory of the well bore can comprise applying the adaptive meshing of the method of this invention to the initial reservoir mesh along the defined trajectory center line. The reservoir mesh can be adapted using the intersections of the well bore center line with the existing reservoir mesh tetrahedron. The resulting reservoir mesh can then be adapted again for the well bore surface defined by the radius from the well bore trajectory center line and the measured depth. The well bore mesh can thus be generated by first applying the adaptive meshing described in the Adaptive Meshing Application to the intersections of the existing reservoir mesh with the defined center line, and then secondly, to the intersections of the newly-generated reservoir mesh with the defined isosurface at a radius r from the trajectory center line.

It is important to note that the well bore isosurface created in the manner described above will not have an ideal top-view cross section of a circle (i.e., a two-dimensional representation of the cylinder). Topologically, the isosurface will be a circle, but it is composed of discrete models of continuous tetrahedrons and thus is not a true circle. However, the approximation can be made better based on the resolution desired for a particular application. The issue becomes one of mesh quality and can be individually configured for a given application. Typically, the approximation of the isosurface will have satisfactory resolution as a result of just the application of the adaptive meshing algorithm as described. However, in the event that a finer resolution is desired, the well bore and/or reservoir mesh can be refined in a manner as disclosed in the Adaptive Meshing Application to increase the general quality of the mesh.

Figure 14A:
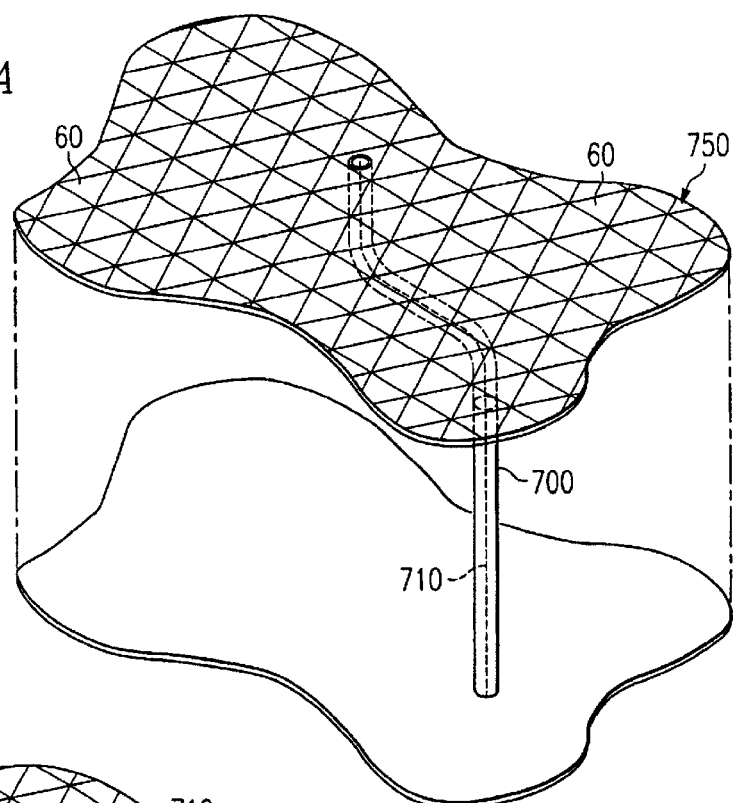
FIGS 14A and 14B are diagrams illustrating an exemplary well bore within an examplary reservoir.
Figure 14B:
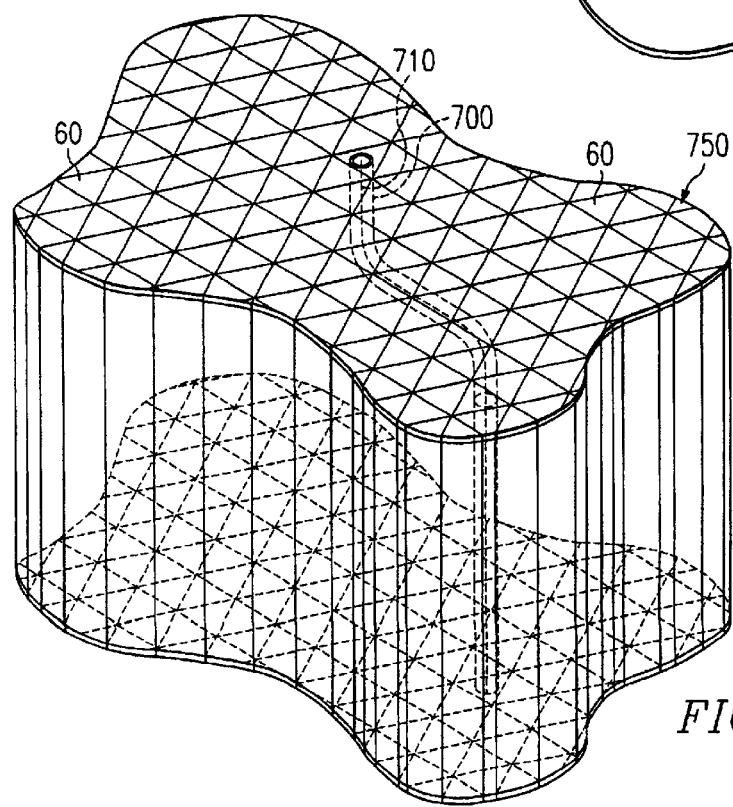

The method and system of the present invention can be used to model a well bore having any orientation, and any arbitrary path within a reservoir. Further any spacing of line segments to define the trajectory can be accommodated, as can any radius as required for a given application. FIGS. 14A and 14B illustrate another embodiment of the method and system of the present invention in which the well bore is defined explicitly. In FIG. 14A, well bore 700 is explicitly defined by generating a mesh along a predefined well bore trajectory 710. A mesh for well bore 700 is defined inside of the boundary of reservoir 750 prior to the generation of the reservoir mesh. Reservoir 750 thus initially only has its boundaries defined (by two-dimensional mesh 760).

The method and system of the present invention can generate a mesh to model reservoir 750 by adapting mesh 760 in accordance with the adaptive meshing techniques previously discussed. Alternatively, mesh 760 can be converted from a two-dimensional mesh to a three-dimensional mesh by means of other meshing techniques, such as the commercially available Inria meshing algorithm. Using such a commercially available meshing algorithm, a user can provide a two-dimensional triangulation to bound a reservoir volume. The software then fills the reservoir volume with tetrahedron in such a way that the triangles that existed on the surface triangulation input by the user are maintained. Each of the triangles on the two dimensional surface triangulation will form a face of one of the volume tetrahedra. This embodiment of the method and system of this invention can thus explicitly define a well bore mesh and its resulting isometric surface and then fill in the reservoir mesh around the well bore mesh. Tetrahedra are thus explicitly proscribed along the defined well bore. The tetrahedron defining the well bore will have triangular surfaces forming the isosurface of the well bore. These triangles on the isosurface can be inputs to the reservoir meshing algorithms, such as Inria, and form part of the surface triangulation that will be maintained by the meshing algorithm when generating the reservoir mesh. In essence, a reservoir volume with a long, skinny hole within it is provided as an input and the meshing algorithm for the reservoir fills in the surrounding volume. Additionally, multi-layer reservoirs can also be provided as inputs with the well bore trajectory going from one layer through and to another layer. The meshing algorithm can generate a mesh for each layer as if they were each separate reservoirs. The boundary between layers then becomes one of the surfaces. FIG. 14B shows the reservoir mesh in place around the well bore.

Figure 15:
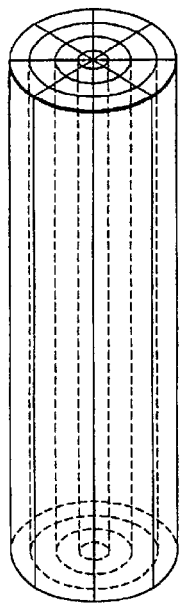
FIG. 15 is a diagram illustrating an exemplary well bore.

In this embodiment of the method and system of the present invention, the well bore trajectory and radius are first defined and then a series of concentric circles of decreasing radius can be defined inside the well bore radius such that if they were to be cut out and separated, they would form a series of concentric tubes in the shape of, and of a corresponding length to the well bore trajectory. The method and system of this invention then comprises a step of dividing the concentric cylindrical tubes along a series of lines bisecting by the well bore center line, as shown in FIG. 15. The result is a series of pie-sliced prisms that can then each be subdivided into tetrahedra in accordance with the teachings of this invention. The adaptive meshing algorithm of the method and system of the present invention is used to generate the tetrahedra that will then comprise the well bore mesh. The adaptive meshing algorithm can similarly be used to redefine the well bore mesh in the event that it passes through separate layers of a multi-level reservoir.

The method and system of this invention can be extended out to greater dimensions, such as the time dimension, using the method disclosed in the Extruding Application. Additionally, an advantage of the embodiments of the method and system of this invention is that they can eliminate the need for user expertise in the field of meshing. For example, a user need only have enough knowledge to input the well bore trajectory, the diameter or radius of the well bore, and the two dimensional triangulation for the surface of the reservoir to be modeled. The algorithms of the embodiments of the present invention, along with an adaptive meshing algorithm such as that disclosed in the Adaptive Meshing Application, or a commercial application such as Inria, can then fill and in generate the necessary meshes. Unlike prior art methods, a large amount of personnel time is not necessary to generate the model meshes. Further, commercial products such as Inria can be used in any embodiment of the method and system of the present invention to generate the reservoir mesh.

The algorithms of the method and system of the present invention can comprise computer executable software instructions and can be stored in memory such as RAM or ROM or any other fixed media, such as a hard drive. The computer executable software instructions of the embodiments of this invention can comprise a part of a larger set of computer-executable software instructions, but can act independently. The method and system of the present invention can be used with a computer graphical user interface, such as that disclosed in related U.S. Patent Application Publication No. 2002/0067373 entitled "SYSTEM AND METHOD FOR DEFINING AND DISPLAYING A RESERVOIR MODEL," filed on Jun. 29, 2001 (the "Work Flow Application"). Further, the inputs necessary for the algorithms of the present invention can be provided directly by a user or can themselves be computer executable software instructions received through a network, or input from some other medium such as a floppy disk or hard drive or other software program, such as an Excel spreadsheet.

One embodiment of the method and system of the present invention can explicitly generate a well bore (as discussed above) for the specific case of a vertical well. In such a case, flow around the well bore is essentially radial. In this situation, using the explicitly defined mesh for the well bore path provides a more suitable mesh forte radial flow condition in that the mesh itself is based on a radial physical configuration. The mesh is designed to more closely resemble the physical system being modeled. Further, the radial transform method of related U.S. Patent Application Publication no. 2002/0082813 entitled "METHOD AND SYSTEM FOR COORDINATE TRANSFORMATION TO MODEL RADIAL FLOW NEAR A SINGULARITY," filed on Jun. 29, 2001 (the "Radial Transformation Application") can be used within the well bore mesh area and surrounding areas to provide a better model solution. In this way, the geometry of the well bore mesh honors the actual physical well geometry while providing a means to more accurately solve the physical system for the properties in the near well region. For example, permeability and porosity near the well bore are important properties that can be measured in the field and then used to model how the property varies with distance and space in the area near the well bore. The mesh inside the well bore provides the ability to get better resolution and, in combination with the improved accuracy provided by the radial transformation disclosed in the Radial Transformation Application, provides for much better solutions in the near well regions then can be provided by prior art methods and systems. It is important to note that once a well bore moves any from the vertical, flow around the well bore becomes less radial. Beyond the near well area, ordinary meshing and ordinary solving techniques can be used.

Additionally, sets of inputs for the near well region of the reservoir can be varying values of, for example, porosity, flow, and permeability. This near well property alteration ("NWPA") provides a means for predicting the behavior in the near well region as values of different properties change. Alterations to the values of properties near the well bore can be input into the models generated by the method and system of the present invention to predict changes in behavior. In this way, potential damage that can result as properties such as conductance (permeability) change can be predicted before it occurs. Also, engineers can more accurately determine how best to extend a well's life, or to increase production. Near well property alteration can thus be used within the well bore mesh to alter the value of properties at different nodes (solution points) to model how a property may vary with, for example, distance. NWPA is thus a mechanism for assigning values to physical parameters in and near the well bore mesh. Property values that can be used for inputs at the well bore nodes can be user obtained measurements or can be arbitrarily determined values. For example, direct and indirect measurements can be made of porosity conductance and flow. NWPA allows a user to specify the resolution for properties in and near the well bore. This provides a more accurate representation of the system being modeled.

Although the present invention has been described in detail herein with reference to the illustrative embodiments, it should be understood that the description is by way of example only and is not to be construed in a limiting sense. It is to be further understood, therefore, that numerous changes in the details of the embodiments of this invention and additional embodiments of this invention will be apparent to, and may be made by, persons of ordinary skill in the art having reference to this description. Many variations, modifications, additions and improvements to the embodiments described above are possible. In particular, these variations may include computer readable media (such as floppy disks, CD-ROMs, DVD-ROMs, etc.,) storage devices, computer memories and the like which contain software, firmware or other programming embodying the foregoing methods. It is contemplated that all such changes and additional embodiments are within the spirit and true scope of this invention as claimed below.

What is claimed is:

1. A computer-implemented method for constructing a representation of a first system for use with a computer graphical user interface, said first system represented by a first finite element mesh, a second system being within said first system, said second system represented by a second finite element mesh, the method comprising:

constructing said first finite element mesh having a plurality of n-dimensional simplices corresponding to said first system;

defining a surface bounding said second system;
identifying a subset of the plurality of n-dimensional simplices of said first finite element mesh that are intersected by said surface;
modifying the identified subset of the plurality of n-dimensional simplices to adapt said first finite element mesh such that it comprises said second finite element mesh and a third finite element mesh, wherein said second finite element mesh comprises a first set of simplices located entirely interior to said surface and wherein said third finite element mesh comprises a second set of simplices located entirely exterior to said surface; and
displaying said first finite element mesh in said computer graphical user interface.

2. The computer-implemented method of claim 1, wherein modifying said identified subset of said plurality of n-dimensional simplices further comprises subdividing each of said simplices in said identified subset into a plurality of new simplices, and wherein a plurality of faces of said subdivided simplices are substantially coincident with said surface.

3. The computer-implemented method of claim 1, wherein modifying said identified subset of the plurality of n-dimensional simplices comprises collapsing each of said simplices in said identified subset.

4. The computer-implemented method of claim 3, wherein each of said n-dimensional simplices has a plurality of nodes and a plurality of edges connecting said nodes, wherein at least one of said nodes is invariant and wherein collapsing each of said simplices in said identified subset comprises removing one or more of said nodes, preventing removal of the invariant nodes, and forming simplices based upon the remaining nodes.

5. The computer-implemented method of claim 1, wherein said first and said second systems are three-dimensional systems, wherein n=3, and wherein said surface is an (n−1)-dimensional surface.

6. The computer-implemented method of claim 5, wherein said (n−1)-dimensional surface corresponds to a well bore surface, and wherein said (n−1)-dimensional surface is defined by a depth along a well bore trajectory and a radius from said well bore trajectory.

7. The computer-implemented method of claim 1, wherein said first system is a reservoir.

8. The computer-implemented method of claim 1, wherein said second system is a well bore.

9. The computer-implemented method of claim 1, wherein said defining step of constructing said first mesh is performed using a mesh generation algorithm.

10. The computer-implemented method of claim 9, wherein said mesh generation algorithm is an Inria meshing algorithm.

11. Them computer-implemented method of claim 1, wherein each of the n-dimensional simplices in said identified subset of the plurality of n-dimensional simplices is intersected by an (n−1)-dimensional surface.

12. The computer-implemented method of claim 11, wherein the (n−1)-dimensional surface intersects at least one edge of each of the n-dimensional simplices in the identified subset of the plurality of n-dimensional simplices.

13. The computer-implemented method of claim 1, wherein each of said n-dimensional simplices has a plurality of nodes and a plurality of edges connecting said nodes, and wherein the method further comprises identifying intersections between the edges of said subset of simplices and said surface, defining a new node at each of said identified intersections, and defining at least two new simplices incorporating said new nodes.

14. The computer-implemented method of claim 1, wherein said first system comprises a multi-level reservoir.

15. The computer-implemented method of claim 1, further comprising the step of altering the value of system properties in said second mesh and in said third mesh near said second mesh to predict changes in system behavior for said second system.

16. The computer-implemented method of claim 1, wherein said method steps are performed on a computer.

17. The computer-implemented method of claim 16, wherein said computer comprises a graphical user interface for inputting user instructions and parameter values.

18. A computer-readable medium containing a plurality of computer-implementable instructions embodying a method for constructing a second finite element mesh within a first finite element mesh to model a second system within a first system modeled by said first mesh, said method comprising:
constructing said first mesh having a plurality of n-dimensional simplices corresponding to said first system;
defining a surface bounding said second system;
identifying a subset of the plurality of n-dimensional simplices of said first mesh that are intersected by said surface; and
modifying the identified subset of the plurality of n-dimensional simplices to adapt said first mesh such that it comprises said second mesh and a third mesh, wherein said second mesh comprises a first set of simplices located entirely interior to said surface and wherein said third mesh comprises a second set of simplices located entirely exterior to said surface.

19. The computer-readable medium of claim 18, wherein said modifying step of said method further comprises subdividing each of said simplices in said identified subset into a plurality of new simplices, and wherein a plurality of faces of said subdivided simplices are substantially coincident with said surface.

20. The computer-readable medium of claim 18, wherein said first and said second systems are three-dimensional systems, wherein n=3, and wherein said surface is an (n−1)-dimensional surface.

21. The computer-readable medium of claim 20, wherein said (n−1)-dimensional surface corresponds to a well bore surface, and wherein said (n−1)-dimensional surface is defined by a depth along a well bore trajectory and a radius from said well bore trajectory.

22. The computer-readable medium of claim 18, wherein said first system is a reservoir.

23. The computer-readable medium of claim 18, wherein said second system is a well bore.

24. The computer-readable medium of claim 18, wherein said defining step of said method further comprises providing a well bore trajectory, a radius from said trajectory, and a depth along said trajectory.

25. The computer-readable medium of claim 18, wherein said step of constructing said first mesh of said method is performed using a mesh generation algorithm.

26. The computer-readable medium of claim 25, wherein said mesh generation algorithm is an Inria meshing algorithm.

27. The computer-readable medium of claim 18, wherein each of the n-dimensional simplices in said identified subset of the plurality of n-dimensional simplices is intersected by an (n−1)-dimensional surface.

28. The computer-readable medium of claim 27, wherein the (n−1)-dimensional surface intersects at least one edge of each of said n-dimensional simplices in said identified subset of said plurality of n-dimensional simplices.

29. The computer-readable medium of claim 18, wherein each of said n-dimensional simplices has a plurality of nodes and a plurality of edges connecting said nodes, and wherein said method further comprises identifying intersections between the edges of said subset of simplices and said surface, defining a new node at each of said identified intersections, and defining at least two new simplices incorporating said new nodes.

30. The computer-readable medium of claim 18, wherein said first system comprises a multi-level reservoir.

31. The computer-readable medium of claim 18, wherein said method further comprises the step of altering the value of system properties in said second mesh and in said third mesh near said second mesh to predict changes in system behavior for said second system.

* * * * *